United States Patent
Hyakutake et al.

(10) Patent No.: US 10,458,010 B2
(45) Date of Patent: *Oct. 29, 2019

(54) SUBSTRATE LIQUID PROCESSING APPARATUS, SUBSTRATE LIQUID PROCESSING METHOD, AND STORAGE MEDIUM

(71) Applicant: Tokyo Electron Limited, Tokyo (JP)

(72) Inventors: Hironobu Hyakutake, Kumamoto (JP); Takafumi Tsuchiya, Kumamoto (JP); Koichiro Kanzaki, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/216,868

(22) Filed: Jul. 22, 2016

(65) Prior Publication Data

US 2017/0037499 A1 Feb. 9, 2017

(30) Foreign Application Priority Data

Aug. 7, 2015 (JP) ................................ 2015-157744

(51) Int. Cl.
 *C23C 2/04* (2006.01)
 *H01L 21/67* (2006.01)
 *G03F 7/42* (2006.01)

(52) U.S. Cl.
 CPC ................ *C23C 2/04* (2013.01); *G03F 7/423* (2013.01); *H01L 21/67086* (2013.01)

(58) Field of Classification Search
 CPC ......... H01L 21/67086; H01L 21/67057; H01L 21/67253; G01N 35/1095; Y10T 436/115831; Y10T 436/12; C23C 2/04; G03F 7/423
 See application file for complete search history.

(56) References Cited

U.S. PATENT DOCUMENTS

| | | | | |
|---|---|---|---|---|
| 5,820,689 A | * | 10/1998 | Tseng | ........................ B08B 9/00 134/10 |
| 2007/0034231 A1 | | 2/2007 | Takahashi | |
| 2008/0035609 A1 | * | 2/2008 | Kashkoush | ....... H01L 21/31111 216/84 |

(Continued)

FOREIGN PATENT DOCUMENTS

JP 2009-260171 A 11/2009
JP 2011-134899 A 7/2011

*Primary Examiner* — Parviz Hassanzadeh
*Assistant Examiner* — Margaret D Klunk
(74) *Attorney, Agent, or Firm* — Abelman, Frayne & Schwab (57) ABSTRACT

Disclosed is a substrate liquid processing apparatus including: a processing bath in which a mixture of sulfuric acid and hydrogen peroxide is stored, and a substrate is immersed in the stored mixture such that a processing is performed on the substrate; an outer bath configured to receive the mixture flowing out from the processing bath; a circulation line configured to return the mixture in the outer bath to the processing bath; a sulfuric acid supply unit configured to supply sulfuric acid to the mixture; a first hydrogen peroxide supply unit configured to supply hydrogen peroxide to the mixture in the outer bath; and a second hydrogen peroxide supply unit configured to supply hydrogen peroxide to the mixture flowing through a downstream portion of the circulation line.

16 Claims, 3 Drawing Sheets

(56) References Cited

U.S. PATENT DOCUMENTS

| | | | |
|---|---|---|---|
| 2011/0126860 A1* | 6/2011 | Hyakutake | H01L 21/67057 |
| | | | 134/19 |
| 2013/0240143 A1* | 9/2013 | Kiyose | B44C 1/227 |
| | | | 156/345.15 |
| 2017/0025268 A1* | 1/2017 | Hyakutake | G03F 7/423 |

* cited by examiner

SUBSTRATE LIQUID PROCESSING APPARATUS, SUBSTRATE LIQUID PROCESSING METHOD, AND STORAGE MEDIUM

CROSS-REFERENCE TO RELATED APPLICATIONS

This application is based on and claims priority from Japanese Patent Application No. 2015-157744 filed on Aug. 7, 2015 with the Japan Patent Office, the disclosure of which is incorporated herein in its entirety by reference.

TECHNICAL FIELD

The present disclosure relates to a technique for replenishing an SPM liquid, which is a mixture of sulfuric acid and hydrogen peroxide, stored in a processing bath with a chemical liquid component (hydrogen peroxide) when performing a processing by immersing a substrate in the SPM liquid.

BACKGROUND

A photolithography technique is used for forming a circuit pattern on a substrate such as, for example, a semiconductor wafer. After a desired circuit pattern is formed, a resist film is removed from the substrate by using a sulfuric acid hydrogen peroxide mixture (SPM) liquid. The resist removal processing is performed, for example, by immersing a plurality of (e.g., fifty (50)) substrates in the SPM liquid stored in a processing bath while the substrates are held by a substrate holder called a wafer boat. The SPM liquid contains Caro's acid which is produced when sulfuric acid and hydrogen peroxide are reacted with each other, and the resist film is removed by being oxidized with Caro's acid (see, e.g., Japanese Patent Laid-Open Publication No. 2011-134899).

A substrate processing apparatus described in Japanese Patent Laid-Open Publication No. 2011-134899 includes a circulation system including a processing bath that stores an SPM liquid, an outer bath that receives the SPM liquid overflowing from the processing bath, and a circulation line connected to nozzles provided in the outer bath and the processing bath. In the circulation line, a pump that forms a circulation flow of the SPM liquid in the circulation system, a heater that heats the SPM liquid, and a filter that removes solid impurities in the SPM liquid, are interposed in this order from the upstream side. A hydrogen peroxide supply line for replenishing the circulation system with hydrogen peroxide is connected to an upstream position of a nozzle close to a nozzle of the circulation line.

In a batch type substrate processing apparatus similar to that described in Japanese Patent Laid-Open Publication No. 2011-134899, the Caro's acid is produced in a concentration and an amount sufficient to remove the resist film from the substrate. Thus, when the resist film is removed from the substrate, the resist film removed from the substrate may not be completely dissolved in the SPM liquid, so that the resist film is dispersed in a form of small pieces in the SPM liquid. When the small pieces of the undissolved resist film flow into a device such as, for example, the pump or the filter provided in the circulation line, the small pieces may attach to the device and adversely affect the device.

SUMMARY

According to an exemplary embodiment, the present disclosure provides a substrate liquid processing apparatus including: a processing bath in which a mixture of sulfuric acid and hydrogen peroxide is stored, and a substrate is immersed in the stored mixture such that a processing is performed on the substrate; an outer bath configured to receive the mixture flowing out from the processing bath; a circulation line configured to return the mixture in the outer bath to the processing bath; a sulfuric acid supply unit configured to supply sulfuric acid to the mixture; a first hydrogen peroxide supply unit configured to supply hydrogen peroxide to the mixture in the outer bath; and a second hydrogen peroxide supply unit configured to supply hydrogen peroxide to the mixture flowing through a downstream portion of the circulation line.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technique capable of supplying hydrogen peroxide in a manner that follows an intended effect.

According to an exemplary embodiment, the present disclosure provides a substrate liquid processing apparatus including: a processing bath in which a mixture of sulfuric acid and hydrogen peroxide is stored, and a substrate is immersed in the stored mixture such that a processing is performed on the substrate; an outer bath configured to receive the mixture flowing out from the processing bath; a circulation line configured to return the mixture in the outer bath to the processing bath; a sulfuric acid supply unit configured to supply sulfuric acid to the mixture; a first hydrogen peroxide supply unit configured to supply hydrogen peroxide to the mixture in the outer bath; and a second hydrogen peroxide supply unit configured to supply hydrogen peroxide to the mixture flowing through a downstream portion of the circulation line.

The above-described substrate liquid processing apparatus further includes a controller configured to control operations of the first hydrogen peroxide supply unit and the second hydrogen peroxide supply unit. The controller sets a supply amount of the hydrogen peroxide supplied from one of the first hydrogen peroxide supply unit and the second hydrogen peroxide supply unit to be greater than a supply amount of the hydrogen peroxide supplied from another one of the first hydrogen peroxide supply unit and the second hydrogen peroxide supply.

In the above-described substrate liquid processing apparatus, the controller sets a supply amount of the hydrogen peroxide supplied from the second hydrogen peroxide supply unit to be greater than a supply amount of the hydrogen peroxide supplied from the first hydrogen peroxide supply unit in a first period after the substrate is introduced into the processing bath, and sets the supply amount of the hydrogen peroxide supplied from the first hydrogen peroxide supply unit to be greater than the supply amount of the hydrogen peroxide supplied from the second hydrogen peroxide supply unit in a second period after the first period.

In the above-described substrate liquid processing apparatus, the controller sets the supply amount of the hydrogen peroxide supplied from the first hydrogen peroxide supply unit to be greater than the supply amount of the hydrogen peroxide supplied from the second hydrogen peroxide supply unit in a third period before the substrate is introduced into the processing bath.

In the above-described substrate liquid processing apparatus, the controller sets a supply rate of the hydrogen peroxide supplied from the second hydrogen peroxide supply unit in the first period to be lower than a supply rate of the hydrogen peroxide supplied from the second hydrogen peroxide supply unit in the other periods.

In the above-described substrate liquid processing apparatus, the supply amount of the hydrogen peroxide supplied from the first hydrogen peroxide supply unit in the first period is zero (0), and the supply amount of the hydrogen peroxide supplied from the second hydrogen peroxide supply unit in the second period is zero (0).

According to another exemplary embodiment, the present disclosure provides a substrate liquid processing apparatus including: a processing bath in which a mixture of sulfuric acid and hydrogen peroxide is stored, and a substrate is immersed in the stored mixture such that a processing is performed on the substrate; an outer bath configured to receive the mixture flowing out from the processing bath; a circulation line configured to return the mixture in the outer bath to the processing bath; a sulfuric acid supply unit configured to supply sulfuric acid to the mixture; a device provided in the circulation line; a first hydrogen peroxide supply unit configured to supply hydrogen peroxide to the mixture in a circulation system including the processing bath, the outer bath, and the circulation line; and a second hydrogen peroxide supply unit configured to supply hydrogen peroxide to the mixture in the circulation system. The device is a filter configured to remove a solid impurity in the mixture, or a pump configured to form a circulation flow of the mixture in the circulation system. The first hydrogen peroxide supply unit is provided in the outer bath, or in the circulation line at an upstream position of the device to supply hydrogen peroxide. The second hydrogen peroxide supply unit is provided in the circulation line at a downstream position of the device to supply hydrogen peroxide.

According to still another exemplary embodiment, the present disclosure provides a substrate liquid processing method using a substrate liquid processing apparatus including: a processing bath in which a mixture of sulfuric acid and hydrogen peroxide is stored, and a substrate is immersed in the stored mixture such that a processing is performed on the substrate; an outer bath configured to receive the mixture flowing out from the processing bath; a circulation line configured to return the mixture in the outer bath to the processing bath; a sulfuric acid supply unit configured to supply sulfuric acid to the mixture; a first hydrogen peroxide supply unit configured to supply hydrogen peroxide to the mixture in the outer bath; and a second hydrogen peroxide supply unit configured to supply hydrogen peroxide to the mixture flowing through a downstream portion of the circulation line. A supply amount of the hydrogen peroxide supplied from the second hydrogen peroxide supply unit is set to be greater than a supply amount of the hydrogen peroxide supplied from the first hydrogen peroxide supply unit in a first period after the substrate is introduced into the processing bath, and the supply amount of the hydrogen peroxide supplied from the first hydrogen peroxide supply unit is set to be greater than the supply amount of the hydrogen peroxide supplied from the second hydrogen peroxide supply unit in a second period after the first period.

In the above-described substrate liquid processing method, the supply amount of the hydrogen peroxide supplied from the first hydrogen peroxide supply unit is set to be greater than the supply amount of the hydrogen peroxide supplied from the second hydrogen peroxide supply unit in a third period before the substrate is introduced into the processing bath.

In the above-described substrate liquid processing method, a supply rate of the hydrogen peroxide supplied from the first hydrogen peroxide supply unit in the second period is set to be lower than a supply rate of the hydrogen peroxide supplied from the first hydrogen peroxide supply unit in the other periods.

In the above-described substrate liquid processing method, the supply amount of the hydrogen peroxide supplied from the first hydrogen peroxide supply unit in the first period is zero (0), and the supply amount of the hydrogen peroxide supplied from the second hydrogen peroxide supply unit in the second period is zero (0).

According to yet another exemplary embodiment, the present disclosure provides a substrate liquid processing method using a substrate liquid processing apparatus including: a processing bath in which a mixture of sulfuric acid and hydrogen peroxide is stored, and a substrate is immersed in the stored mixture such that a processing is performed on the substrate; an outer bath configured to receive the mixture flowing out from the processing bath; a circulation line configured to return the mixture in the outer bath to the processing bath; a sulfuric acid supply unit configured to supply sulfuric acid to the mixture; a device provided in the circulation line, the device being a filter configured to remove a solid impurity in the mixture, or a pump configured to form a circulation flow of the mixture in the circulation system; a first hydrogen peroxide supply unit configured to supply hydrogen peroxide to the mixture in a circulation system including the processing bath, the outer bath, and the circulation line, the first hydrogen peroxide supply unit being provided to supply hydrogen peroxide to the outer bath, or to the circulation line at an upstream position of the device; and a second hydrogen peroxide supply unit configured to supply hydrogen peroxide to the mixture in the circulation system, the second hydrogen peroxide supply unit being provided to supply hydrogen peroxide to the circulation line at a downstream position of the device. A supply amount of the hydrogen peroxide supplied from the second hydrogen peroxide supply unit is set to be greater than a supply amount of the hydrogen peroxide supplied from the first hydrogen peroxide supply unit in a first period after the substrate is introduced into the processing bath, and the supply amount of the hydrogen peroxide supplied from the first hydrogen peroxide supply unit is set to be greater than the supply amount of the hydrogen peroxide supplied from the second hydrogen peroxide supply unit in a second period after the first period.

According to still yet another exemplary embodiment, the present disclosure provides a non-transitory computer-readable storage medium that stores a program for controlling a substrate processing apparatus in which, when executed, cause a computer to control the substrate liquid processing apparatus and execute the substrate liquid processing method.

According to the present disclosure, since the hydrogen peroxide concentration in the processing bath is rapidly increased by supplying hydrogen peroxide by the first hydrogen peroxide supply unit, the processing of the substrate in the processing bath may be facilitated. In addition, since the hydrogen peroxide concentration in the outer bath or in the circulation line at the downstream side thereof is rapidly increased by supplying hydrogen peroxide by the second hydrogen peroxide supply unit, dissolution of undissolved substances flowing out from the processing bath in the mixture may be facilitated. As the first hydrogen peroxide supply unit and the second hydrogen peroxide supply unit are separately used as appropriate, the liquid processing apparatus may be effectively operated.

Figure 1:
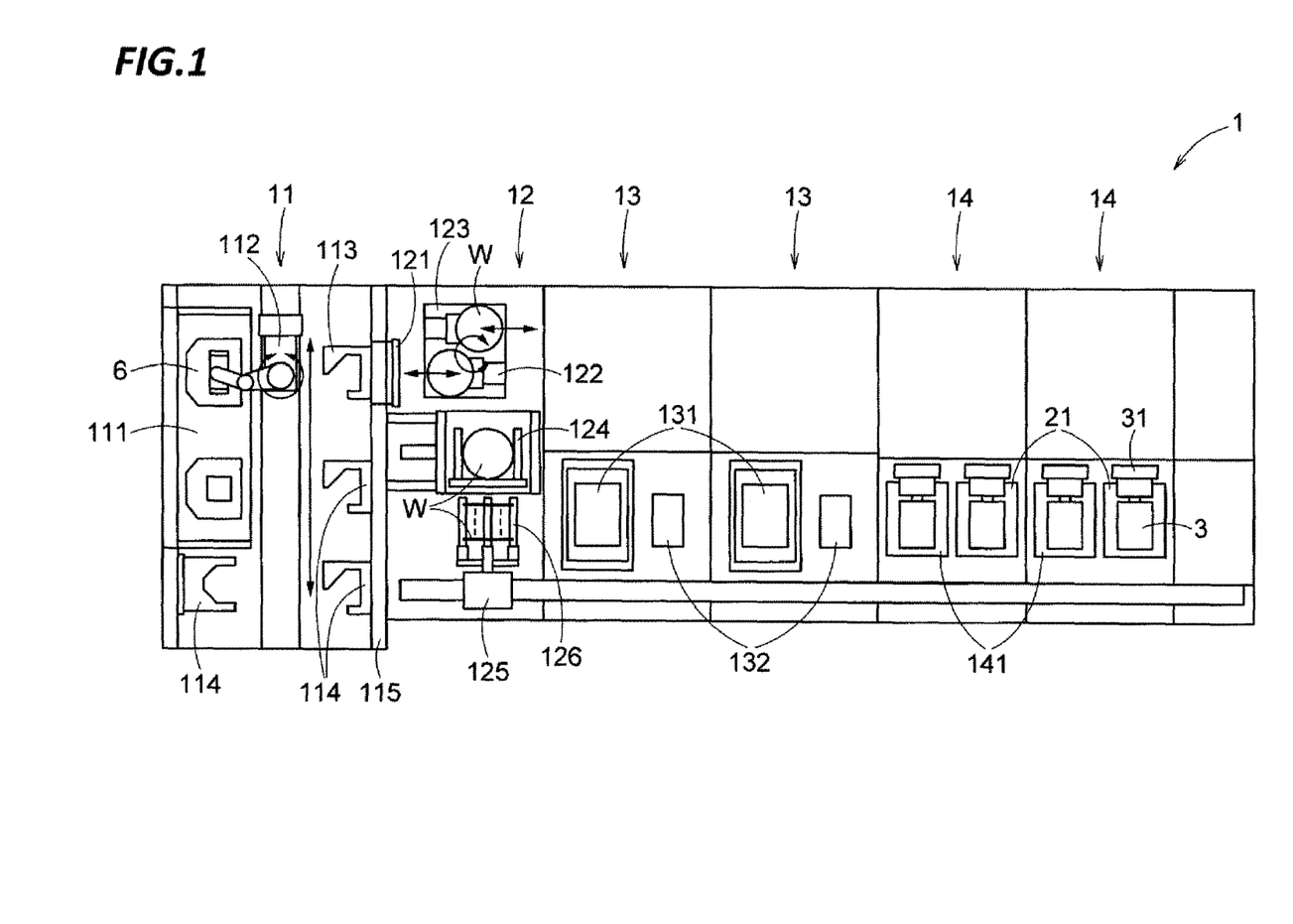
FIG. 1 is a plan view illustrating the whole configuration of a substrate processing system provided with an SPM processing apparatus according to an exemplary embodiment of the present disclosure.
Figure 2:
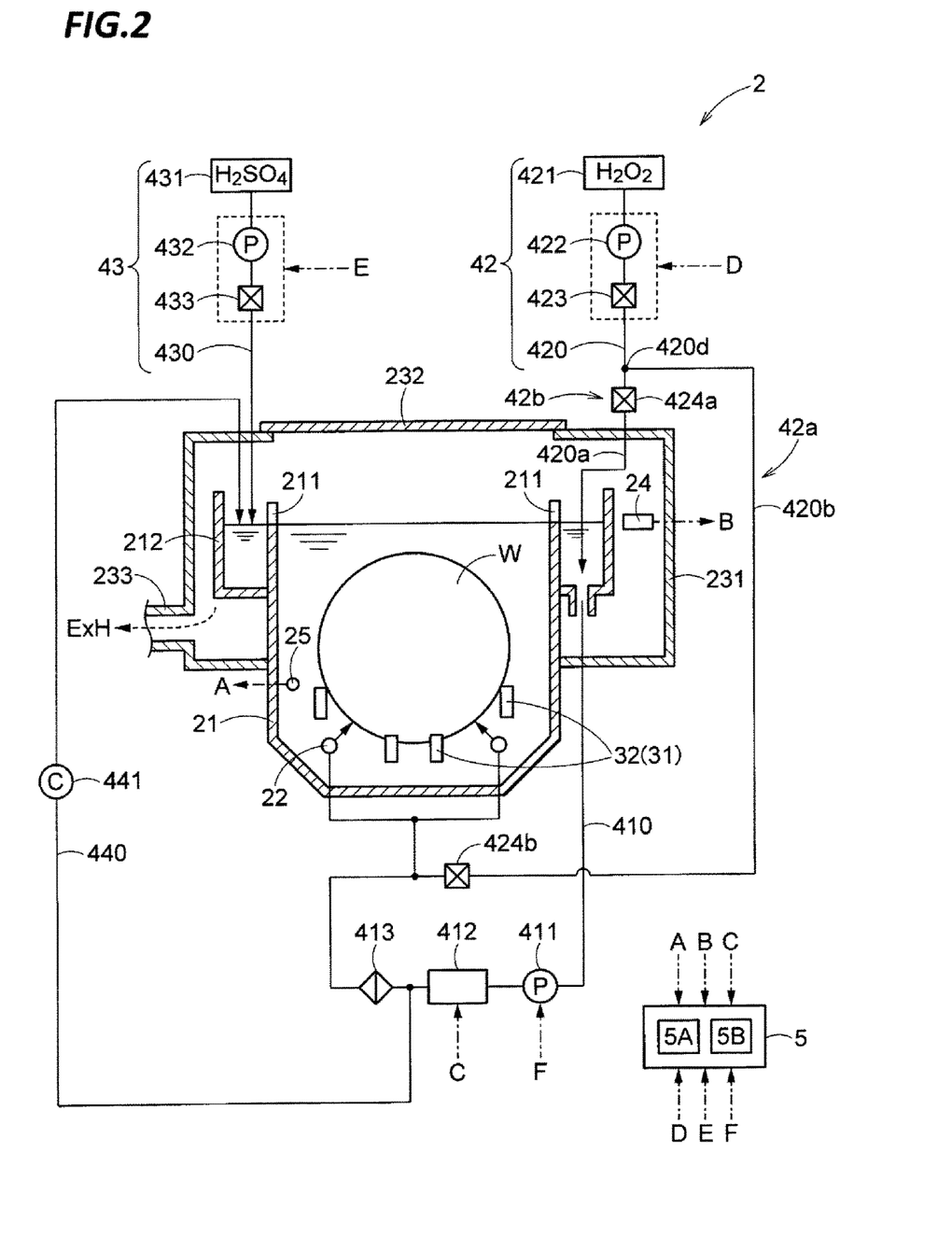
FIG. 2 is a piping diagram including a vertical-sectional view of a processing bath for explaining the configuration of the SPM processing apparatus.

First, descriptions will be briefly made on a wafer processing system 1 provided with an SPM processing apparatus 2, which is an exemplary embodiment of the substrate liquid processing apparatus, with reference to FIGS. 1 and 2. The wafer processing system 1 includes a carry-in/out section 11 configured to perform a carry-in/out of a FOUP 6, an interface section 12 configured to perform an arrangement and a posture change of wafers W, two (2) drying processing sections 13 each configured to dry the wafers W, and two (2) SPM processing sections 14 each configured to perform an SPM processing.

The carry-in/out section 11 is provided with a placing table 111 configured to receive or deliver the FOUP 6 from or to an external conveyance device, a first conveyance arm 112 configured to convey the FOUP 6 in the carry-in/out section 11, a delivery table 113 configured to place the FOUP 6 thereon for the carry-in/out of the wafers W to/from the FOUP 6, and storage shelves 114 configured to temporarily store the FOUP 6 after taking out the wafers W.

The first conveyance arm 112 may convey the FOUP 6 among the placing table 111, the delivery table 113, and each storage shelf 114. The delivery table 113 is fixed to a partition wall 115 that separates the carry-in/out section 11 and the interface section 12. The partition wall 115 is provided with a door 121 that has a function to attach and detach a cover provided on the front surface of the FOUP 6.

The interface section 12 is provided with two (2) delivery arms 122 configured to perform a take-out or storage of the wafer W with respect to the FOUP 6 placed on the delivery table 113, a posture changing device 124 configured to perform a posture change of the wafers W, and a second conveyance arm 125 configured to convey the wafers W among the interface section 12, each drying processing section 13, and each SPM processing section 14.

The delivery arms 122 are provided on a rotatable arm table 123. Each delivery arm 122 is capable of holding a plurality of wafers W with a horizontal posture side by side in the vertical direction. The posture changing device 124 may rotate the plurality of wafers W held together to switch between a state where the wafers W line up with a horizontal posture in the vertical direction and a state where the wafers W line up with a vertical posture in the horizontal direction. The second conveyance arm 125 may move fifty (50) wafers W that line up with a vertical posture in the horizontal direction, in a state of being held by a wafer supporter 126, horizontally among the interface section 12, each drying processing section 13, and each SPM processing section 14.

Each drying processing section 13 is provided with an arm cleaning unit 132 configured to clean the wafer supporter 126 of the second conveyance arm 125, and a wafer drying unit 131 configured to perform a drying processing on the wafers W and the wafer supporter 126 after cleaning.

Each SPM processing section 14 is provided with an SPM processing bath 21 configured to store an SPM liquid, and a rinse bath 141 configured to store a rinse liquid (e.g., pure water) for a rinse processing of the wafer W after a SPM processing. A wafer boat 3 and an elevating mechanism 31 thereof are provided in the SPM bath 21 and the rinse bath 141. The wafer boat 3 is capable of holding a plurality of wafers W in the same posture and arrangement as those taken when the second conveyance arm 125 holds the wafers W. The elevating mechanism 31 moves up and down the wafer boat 3 between a delivery position where the delivery of the wafers W is performed between the wafer boat 3 and the second conveyance arm 125, and a processing position where the wafers W held by the wafer boat 3 is immersed in the SPM liquid within the SPM processing bath 21.

As illustrated in FIG. 2, the wafer boat 3 includes four rod-shaped wafer supports 32 extending in a direction perpendicular to the paper surface. Each wafer supporter 32 includes a plurality of (fifty (50) to fifty two (52)) wafer holding grooves (not illustrated) formed at intervals along the longitudinal direction. The wafer support 32 is fixed to a base (not illustrated) which is moved up and down by the elevating mechanism 31.

The SPM processing bath 21 is made of quartz or polypropylene. An outer tank 212 surrounds the whole circumference of the upper end portion of the SPM processing bath 21, and receives an SPM liquid overflowing from the SPM processing bath 21. A plurality of V-shaped notches 211 are formed in the upper peripheral portion of the SPM processing bath 21. By forming the notches 211, the SPM liquid flows out smoothly from the upper end of the SPM processing bath 21.

Two rod-shaped SPM supply nozzles 22 are provided in the bottom portion within the SPM processing bath 21 to supply the SPM liquid into the SPM processing tank 21. Each SPM supply nozzle 22 includes a number of injection holes 221 formed at an interval in the longitudinal direction. The SPM supply nozzles 22 inject the SPM liquid obliquely upwardly toward the wafer W immersed in the SPM liquid within the SPM processing bath 21, in a state where the wafers W are held at an interval in the horizontal direction (the direction perpendicular to the paper surface of FIG. 2) with a posture perpendicular to the wafer boat 3.

One end of a circulation line 410 is connected to the bottom wall of the outer bath 212. The other end of the circulation line 410 is connected to the SPM supply nozzles 22. In the circulation line 410, a pump 411 configured to form a flow of the SPM liquid from the outer bath 212 toward the SPM processing bath 21 (the SPM supply nozzles 22 in the SPM processing bath 21), a heater 412 configured to heat the SPM liquid, and a filter 413 configured to remove solid impurities in the SPM liquid are interposed in this order. During the normal operation of the SPM processing apparatus 2, the pump 411 is always operated, and the SPM liquid overflowing from the SPM processing bath 21 to the outer bath 212 returns to the SPM processing bath 21 through the circulation line 410 and the SPM supply nozzle 22.

Based on the temperature of the SPM liquid detected by a temperature sensor 25 provided in the SPM processing bath 21, a power to be supplied to the heater 412 is controlled such that the temperature of the SPM liquid within the SPM processing bath 21 is to be a predetermined temperature, for example, a temperature in a range of 100° C. to 130° C.

At a downstream side of the pump 411, a sampling line 440 for monitoring a chemical liquid component concentration is branched from the circulation line 410. The sampling line 440 is interposed with a concentration measuring device 441 configured to monitor the concentration of the chemical liquid components contained in the SPM liquid (i.e., hydrogen peroxide concentration and sulfuric acid concentration). The downstream end of the sampling line 440 is connected to the outer bath 212, and the SPM liquid flowing from the circulation line 410 to the sampling line 440 returns to the outer tank 212.

The SPM processing apparatus 2 includes a hydrogen peroxide supply unit 42 configured to supply hydrogen peroxide to any one of the outer bath 212 and the circulation line 410, that is, a first chemical liquid component supply unit. The hydrogen peroxide supply unit 42 includes a hydrogen peroxide tank 421 and a hydrogen peroxide supply line 420 connected thereto, and further includes a hydrogen peroxide supply pump 422 and an opening/closing valve 423 interposed in the hydrogen peroxide supply line 420. The hydrogen peroxide supply line 420 is branched into a first branch supply line 420a and a second branch supply line 420b at a branch point 420d on a downstream side of the opening/closing valve 423.

The first branch supply line 420a is connected to the outer bath 212. The second branch supply line 420b is connected to a downstream portion of the circulation line 410, specifically a downstream side of the filter 413 or a downstream side of the pump 411 in the circulation line 410 (preferably, a downstream side of the pump 411, which is a device at a farther downstream side in the circulation line 410) at a position as close to the SPM supply nozzle 22 as possible. Opening/closing valves 424a and 424b are interposed in the first branch supply line 420a and the second branch supply line 420b, respectively. When the opening/closing valves 424a, 424b are switched, one of the first branch supply line 420a and the second branch supply line 420b may be in communication with the hydrogen peroxide supply line 420.

Hereinafter, in the present specification, for convenience of explanation, the hydrogen peroxide tank 421, the hydrogen peroxide supply line 420, the hydrogen peroxide supply pump 422, the opening/closing valve 423, and the first branch supply line 420a will be referred to as a "first hydrogen peroxide supply unit 42a." In addition, the hydrogen peroxide tank 421, the hydrogen peroxide supply line 420, the hydrogen peroxide supply pump 422, the opening/closing valve 423, and the first branch supply line 420b will be referred to as a "second hydrogen peroxide supply unit 42b." In the illustrated example, the first hydrogen peroxide supply unit 42a and the second hydrogen peroxide supply unit 42b share the components at an upstream side of the branch point 420d, but not limited thereto. The first hydrogen peroxide supply unit 42a and the second hydrogen peroxide supply unit 42b may be liquid supply units completely independent from each other, or may share the hydrogen peroxide tank 421 only.

The outer bath 212 is also connected with a sulfuric acid tank 431 through a sulfuric acid supply line 430. In the sulfuric acid supply line 430, a sulfuric acid supply pump 432 and an opening/closing valve 433 are interposed in sequence. The sulfuric acid tank 431, the sulfuric acid supply pump 432, and the opening/closing valve 433 constitute a sulfuric acid supply unit 43, that is, a second chemical liquid component supply unit.

The pipe constituting the first branch hydrogen peroxide supply line 420a is opened at a height position adjacent to the bottom wall of the outer bath 212. The pipe constituting the sulfuric acid supply line 430 is opened at a relatively high height position in the outer bath 212. Thus, the hydrogen peroxide having a low specific gravity is sufficiently mixed with the SPM liquid. Further, the pipe constituting the hydrogen peroxide supply line 420 may be inserted into the inside of the discharge port formed in the bottom wall of the outer bath 212 (the discharge port is connected with the circulation line 410) such that the tip end (opening end) of the pipe (i.e., the supply point of hydrogen peroxide from the first branch supply line 420a) is positioned, for example, about 1 cm downward from the inlet of the discharge port. Further, the supply point of hydrogen peroxide from the first branch supply line 420a may be set at an upstream position of the filter 413 or an upstream position of the pump 411 in the circulation line 410 (preferably, an upstream side of the pump 411, which is a device at a further upstream side in the circulation line 410). In this case, the supply point of hydrogen peroxide may be provided as upstream as possible in the circulation line 410 such that the supplied hydrogen is sufficiently mixed with the SPM liquid flowing through the circulation line before the hydrogen peroxide reaches the filter 413 or the pump 411.

Similarly to the SPM processing bath 21, the outer bath 212 is made of a transparent member such as, for example, quartz or polypropylene. For example, an optical liquid level sensor 24 is provided to detect whether the liquid level in the outer bath 212 is higher than a predetermined height in advance. When the liquid level is low, the chemical liquid components are replenished in a determined ratio by the hydrogen peroxide supply unit 42 and the sulfuric acid supply unit 43 regardless of a feedback control of the chemical liquid concentration (to be described later).

A hood 231 covers the SPM processing bath 21 and the outer bath 212. The hood 231 suppresses the inside of the wafer processing system 1 from being contaminated due to the diffusion of SPM vapors evaporated from the SPM processing bath 21 and the outer bath 212. The atmosphere within the hood 231 is discharged to a factory exhaust system through an exhaust path 233 connected to a lower sidewall of the hood 231. A cover 232 is provided on the top surface of the hood 231. During the carry-in/out of the wafers W, the cover 232 is opened, so that the wafer boat 3 holding the wafers W can be moved up and down.

Further, the wafer processing system 1 includes a control device 5. The control device 5 is, for example, a computer, and includes a controller 5A and a storage unit 5B. The storage unit 5B stores a program that controls various processings performed in the wafer processing system 1. The controller 5A controls the operations of the wafer processing system 1 including the SPM processing apparatus 2 by reading and executing the program stored in the storage unit 5B.

Further, the program may be recorded in a computer-readable storage medium, and installed from the storage medium to the storage unit 5B of the control device 5. The computer-readable recording medium may be, for example, a hard disc (HD), a flexible disc (FD), a compact disc (CD), a magnet optical disc (MO), or a memory card.

Hereinafter, the operations of the wafer processing system 1 will be described. A FOUP 6 which accommodates twenty five (25) wafers W is carried to the placing table 111 by an external conveyance robot. The FOUP 6 is moved to the delivery table 113 by the first conveyance arm 112.

The door 121 having a cover detachable function removes the cover of the FOUP 6. Any one of the two delivery arms 122 enters into the FOUP 6 and takes out the wafers W. The cover is attached to the empty FOUP 6, and then, the first conveyance arm 112 moves the delivery table 6 to the storage shelf 114.

The arm table 123 is rotated such that the delivery arm 122 faces the posture changing device 124. The wafers W are delivered from the delivery arm 122 to the posture changing device 124.

The posture changing device 124 performs an interval adjustment and a posture change of the wafers W, and then, delivers the wafers W to the second conveyance arm 125 positioned in the interface section 12. The same operation is performed on twenty five (25) wafers W taken out from another FOUP 6, and thus, the second conveyance arm 125 holds fifty (50) wafers W. Then, the second conveyance arm 125 carries the wafers W into one of the two SPM processing sections 14. That is, the wafers W are delivered from the second conveyance arm 125 to the wafer boat 3 at a move-up position.

Subsequently, the wafer boat 3 is moved down so that the wafers W are immersed in the SPM liquid within the SPM processing bath 21, and the cover 232 of the hood 231 is closed. When the wafers W are immersed in the SPM liquid for a predetermined period of time (e.g., 10 minutes to 15 minutes), the resist film present on the surface of the wafers W is removed. The resist film removal processing (SPM processing) and SPM liquid concentration management will be described later.

Subsequently, the cover 232 is opened, so that the wafer boat 3 is moved up, and the second conveyance arm 125 receives the SPM-processed wafers W from the wafer boat 3. Then, the cover 232 is closed. The second conveyance arm 125 carries the wafers W into the rinse bath 141, and a pure water rinse of the wafers W is performed therein. Subsequently, the wafers W are conveyed to the drying processing section 13, and a drying processing of the wafers W with IPA vapor is performed therein. The wafers W are conveyed to the interface section 12 by the second conveyance arm 125.

Thereafter, the fifty (50) wafers W are changed in posture by the posture changing device 124 in reverse order to the order as described above, and then, returned to the original FOUPs 6 by twenty five (25) sheets by the delivery arm 122. The FOUP 6 that accommodates the processed wafers W is moved onto the placing table 111 by the first conveyance arm 112.

Hereinafter, descriptions will be made on the SPM processing and the SPM concentration management performed in the SPM processing bath 21 in detail.

Main chemical reactions related to the SPM liquid are as follows.

$H_2O_2$ self-decomposition reaction: $H_2O_2 \rightarrow H_2O + \frac{1}{2}O_2$ Redox reaction: $H_2SO_4 + H_2O_2 \rightarrow H_2SO_5 + H_2O \rightarrow H_2SO_4 + H_2O + \frac{1}{2}O_2$ Resist oxidation reaction: $H_2SO_5 + C$ (resist) $\rightarrow H_2SO_4 + CO_2$ Accordingly, variation in $H_2O_2$ (hydrogen peroxide) and $H_2SO_4$ (sulfuric acid) in the SPM liquid is as follows.

$H_2O_2$ (hydrogen peroxide) is changed to water by a reaction producing Caro's acid ($H_2SO_5$) that contributes to the resist oxidation reaction, as well as by the self-decomposition reaction. Accordingly, the total amount and concentration of hydrogen peroxide contained in the SPM liquid decrease with the lapse of time.

The total amount of sulfuric acid in the SPM liquid does not decrease with the lapse of time by the chemical reactions as described above. However, since water derived from the hydrogen peroxide by the chemical reactions as described above is produced in a large amount, the concentration of sulfuric acid contained in the SPM liquid decreases with the lapse of time.

Further, in addition to the above, when the wafers W with resist attached thereto are immersed in the SPM liquid, the resist oxidation reaction occurs, and thus, the redox reaction is facilitated. Therefore, the hydrogen peroxide concentration in the SPM liquid rapidly decreases. In addition, since water derived from the hydrogen peroxide concentration increases, the sulfuric acid concentration also decreases.

Other factors influencing the change in concentrations of hydrogen peroxide and sulfuric acid are that water contained in the SPM liquid heated at a relatively high temperature (e.g., 100° C. to 130° C.) is evaporated, and that, when the processed wafers W are conveyed from the SPM processing bath 21 to the rinse bath 141, the SPM liquid is carried out from the SPM processing bath 21 along with the wafers W. However, the influence of these factors is less significant as compared with the above chemical reactions.

In order to appropriately process the wafers W with the resist attached thereto, the Caro's acid concentration in the SPM liquid needs to be maintained in a proper range. To this end, the hydrogen peroxide concentration and the sulfuric acid concentration need to be maintained in a proper range.

Thus, the hydrogen peroxide concentration and the sulfuric acid concentration in the SPM liquid are constantly monitored by the concentration measuring device 441 provided in the sampling line 440. When the hydrogen peroxide concentration detected by the concentration measuring device 441 falls below a predetermined allowable lower limit (management value), hydrogen peroxide is supplied to the SPM liquid by the hydrogen peroxide supply unit 42 under the feedback control. The supply of hydrogen peroxide may be performed by opening the opening/closing valves 423, 424$a$, and driving the hydrogen peroxide supply pump 422. When the sulfuric acid concentration detected by the concentration measuring device 441 falls below a predetermined allowable lower limit (management value), sulfuric acid is supplied to the SPM liquid by the sulfuric acid supply unit 43 under the feedback control. The supply of sulfuric acid may be performed by opening the opening/closing valve 433, and driving the hydrogen peroxide supply pump 432. Further, the second hydrogen peroxide supply unit 42$b$ may be used when the SPM liquid is replenished with hydrogen peroxide by the feedback control.

For the reasons that it takes some time until the SPM liquid in which the concentrations of sulfuric acid and hydrogen peroxide present in the processing bath 21 are reduced reaches the concentration measuring device 441 through the sampling line 440, and that it takes some time until the sulfuric acid and the hydrogen peroxide reaches the processing bath 21 from the supply line after being supplied from the supply units, it is difficult to increase the response speed of the feedback control. Hence, the feedback control of the hydrogen peroxide concentration may be performed as follows. That is, when it is detected by the concentration measuring device 441 that the hydrogen peroxide concentration falls below the predetermined lower limit, a predetermined certain amount of hydrogen peroxide is supplied from the hydrogen peroxide supply unit 42 to the SPM liquid. For the supply, as the hydrogen peroxide supply pump 422, a metering pump (e.g., a diaphragm pump) may be used. When the hydrogen peroxide concentration is still below the lower limit even after a predetermined time elapses from the supply of the certain amount of hydrogen peroxide, the aforementioned certain amount of hydrogen peroxide are further supplied to the SPM liquid. The feedback control of the sulfuric acid may be performed in the same manner That is, as the sulfuric acid supply pump 432, a metering pump such as, for example, a diaphragm pump may also be used. Further, as for the supply amount from the metering pump, the supply amount may be changed by changing, for example, the number of times of the reciprocation of the piston of the metering pump. In addition, as for the supply rate from the metering pump, the supply rate may be changed by changing, for example, the operating speed of the piston of the metering pump.

Meanwhile, in a batch processing apparatus, a number of wafers (about fifty (50) wafers in a recent general batch processing apparatus) are simultaneously processed at a time. Thus, when a number of wafers W are introduced into the SPM processing bath 21, the chemical liquid components in the SPM liquid are rapidly consumed, so that the chemical liquid component concentration is rapidly reduced. At this time, since it is difficult to increase the response speed of the feedback control as described above, it takes some time until the chemical liquid component concentration rapidly reduced immediately after the introduction of the wafers W is restored. Until the chemical liquid concentration is restored, the wafers W are processed with a SPM liquid having a low Caro's acid concentration, resulting in a longer time required to completely peel the resist.

In order to solve the problem, the present exemplary embodiment estimates the reduction of the chemical liquid component concentration in the SPM liquid occurring due to the reaction between the introduced wafers W and the SPM liquid after the introduction of the wafers W. Then, the chemical liquid components are supplied from the hydrogen peroxide supply unit 42 and the sulfuric acid supply unit 43 to the SPM liquid in an amount required to offset the estimated reduction of the chemical liquid concentration (or substantially the same amount as the required amount) over a period immediately before and after the introduction of the wafers W into the SPM liquid (e.g., a period from 1 minute before the introduction of the wafers W to 1 minute after the introduction of the wafers W) (pre-replenishment). During the pre-replenishment of the chemical liquid components at the time of the introduction of the wafers W, the above-described feedback control is invalidated, and after the pre-replenishment of the chemical liquid components is completed, the above-described feedback control is validated again.

The amount required to offset the reduction of the chemical liquid concentration may be determined by calculation (simulation), by experiment, or in combination of experiment and calculation. When determined by experiment, for example, in a case where a normal feedback is performed only, the amount of hydrogen peroxide (or sulfuric acid) supplied from the hydrogen peroxide supply unit 42 (or the sulfuric acid supply unit 43) for a period until the wafers W are taken out after the introduction to the SPM processing tank 21, is measured, and the amount may be considered as an amount required to offset the reduction of the chemical liquid component concentration.

The reduction of the chemical liquid component concentration in the SPM liquid due to the processing of the wafers W is influenced by various conditions (hereinafter, referred to as "workpiece parameters") such as, for example, the number of wafers W to be processed at a time (batch size), the thickness, total area, or total volume of the resist film, the kind of the resist, presence or absence of an additional processing (e.g., ion implantation or ashing), or a magnitude thereof (e.g., an ion implantation amount in the ion implantation). Therefore, the supply amount of the chemical liquid components required to offset the reduction of the chemical liquid component concentration (hereinafter, referred to as a "required replenishment amount") may be determined in consideration of the workpiece parameters. The required replenishment amount corresponding to a combination of various workpiece parameters may be stored in the storage unit 5B of the control device 5. In this case, the control device 5 grasps a workpiece parameter related to the wafers W to be processed by the SPM processing apparatus 2 from now on, and draws a required replenishment amount corresponding to the grasped workpiece parameter, from the storage unit 5B. The parameter related to the wafers W to be processed from now on may be grasped, for example, by referring to a process recipe stored in the storage unit 5B, or receiving information from a host computer that manages operations of various processing systems provided in a semiconductor manufacturing factory.

Without using the control procedure as described above, the pre-replenishment may be defined in advance by a process recipe stored in the storage unit 5B of the control device 5. That is, for example, command values corresponding to the operation that "hydrogen peroxide is supplied from the first hydrogen peroxide supply unit 42a at a flow rate of X1 liters per second for Y1 seconds" and the operation that "sulfuric acid is supplied from the sulfuric acid supply unit 43 to the outer bath 212 at a flow rate of X2 liters per second for Y2 seconds" Z1 seconds before performing the operation of "the wafer boat 3 is moved down to the processing position to immerse unprocessed wafers W into the SPM liquid stored in the SPM processing bath 21," and command values corresponding to the operation that "hydrogen peroxide is supplied from the second hydrogen peroxide supply unit 42b at a flow rate of X1 liters per second for Y1' seconds" and the operation that "sulfuric acid is supplied from the sulfuric acid supply unit 43 at a flow rate of X2 liters per second for Y2' seconds" Z1' seconds after performing the operation that "the wafer boat 3 is moved down to the processing position to immerse unprocessed wafers W into the SPM liquid stored in the SPM processing bath 21," may be incorporated into the process recipe.

In general, in the wafer processing system 1, an operation called a mapping that confirms the accommodation state of the wafers W in the FOUP 6 is performed after the FOUP 6 is placed on the delivery table 113 and the cover of the FOUP 6 is removed, and before the delivery arm 122 takes out the wafers W from the FOUP 6. For the mapping operation, an optical mapping sensor (not illustrated) is provided in the interface section 12. Data about the number of the wafers W accommodated in the FOUP 6 detected during the mapping may be used as one of the workpiece parameters. As described above, in the case where the chemical liquid replenishment before the introduction of the wafers W is defined by a process recipe, the supply time of the chemical liquid components defined by the process recipe may be changed according to the data of the wafers detected during the mapping. That is, in a case where fifty (50) wafers W are processed at a time (i.e., the batch size is 50), when the batch size of the wafers W to be processed at the end of a single processing lot is 30, the replenishment amount of the chemical liquid components before the introduction of the wafers W may be corrected to, for example, ⅔ of the amount defined by the process recipe. Instead of using the data of the wafer mapping as described above, a wafer counter (not illustrated) may be provided in the conveyance path of the wafers W from the FOUP 6 to the SPM processing bath 21 to grasp the number of wafers W to be processed at once in the processing bath 21, based on the number of the wafers W measured by the wafer counter.

In the present exemplary embodiment, in performing the pre-replenishment, some of the total replenishment amount of hydrogen peroxide determined as described above is supplied from the first hydrogen peroxide supply unit 42*a*, and the rest thereof is supplied from the second hydrogen peroxide supply unit 42*b*.

Figure 3:
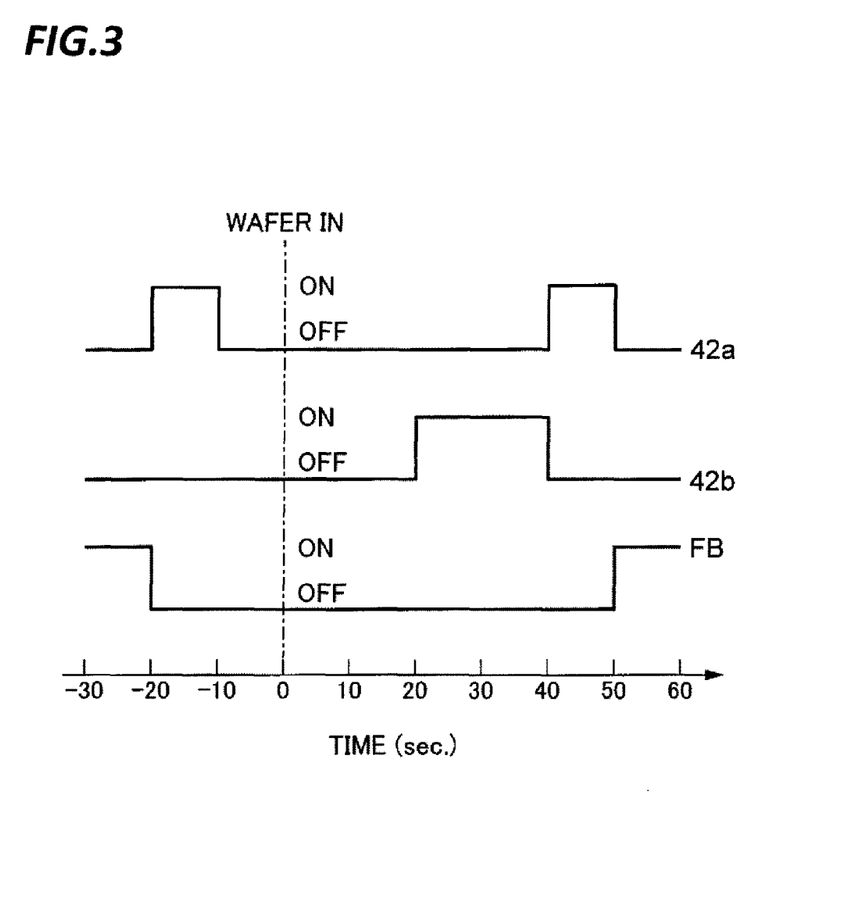
FIG. 3 is a time chart for explaining a pre-replenishment.

Hereinafter, descriptions will be made on an exemplary proper use of the first hydrogen peroxide supply unit 42*a* and the second hydrogen peroxide supply unit 42*b* with reference to the time chart of FIG. 3. In the time chart of FIG. 3, the upper line represents ON/OFF of the hydrogen peroxide supply from the first hydrogen peroxide supply unit 42*a*, the middle line represents ON/OFF of the hydrogen peroxide supply from the first hydrogen peroxide supply unit 42*b*, and the lower line represents ON/OFF of the feedback control performed based on the detection values of the concentration measuring device 441. The feedback control is invalidated (OFF) during a period from 20 seconds before the introduction time of the wafers W (WAFER IN) when the pre-replenishment is performed, to 50 seconds after the introduction time of the wafers W.

First, during the period from 20 seconds before the introduction time of the wafers W to 50 seconds after the introduction time of the wafers W, the hydrogen peroxide supply pump 422 is operated, the opening/closing valve 424*a* is opened, the opening/closing valve 424*b* is maintained in the closed state, and 30 ml of hydrogen peroxide is supplied to the outer bath 212 by the first hydrogen peroxide supply unit 42*a*. Once pumping 30 ml of hydrogen peroxide, the hydrogen peroxide supply pump 422 formed as a metering pump stops the operation thereof. In addition, the opening/closing valves 424*a*, 424*b* are closed (first replenishment step). The first replenishment step is performed for the purpose of increasing, as a whole, the hydrogen peroxide concentration in the SPM liquid present in the circulation system before the introduction of the wafers W. The first replenishment step may be performed using the second hydrogen peroxide supply unit 42*b*.

Next, during the period from 20 seconds after the introduction time of the wafers W to 40 seconds after the introduction time of the wafers W, the hydrogen peroxide supply pump 422 is operated, the opening/closing valve 424*b* is opened, and 60 ml of hydrogen peroxide is supplied to the circulation line 410 by the second hydrogen peroxide supply unit 42*a* (second replenishment step). In the time zone in which the second replenishment step is performed, the reaction with the resist on the surface of the wafers W rapidly progresses in the SPM processing bath 21, so that the hydrogen peroxide concentration and the Caro's acid concentration in the SPM liquid within the SPM processing bath 21 are rapidly reduced. Thus, hydrogen peroxide is supplied to a position just upstream of the SPM processing bath 21 in the circulation path of the SPM liquid, so that the hydrogen peroxide concentration of the SPM liquid in the SPM processing bath 21 is rapidly increased. Therefore, since the Caro's acid concentration in the SPM liquid within the SPM processing bath 21 is also increased, it is possible to prevent or suppress the resist film peeling time from becoming longer.

Next, after 40 seconds from the time point of the introduction of the wafers W, the opening/closing valve 424*b* is closed and the opening/closing valve 424*a* is opened while continuously operating the hydrogen peroxide supply pump 422. Then, during a period until after 50 seconds from the time point of the introduction of the wafers W, 30 ml of hydrogen peroxide is supplied to the outer bath 212 by the first hydrogen peroxide supply unit 42*a* (third replenishment step). The time zone in which the third replenishment step is performed is a time zone in which small pieces of the undissolved resist film peeled from the wafers W flow out the most from the processing bath 21 to the outer bath 212. The small pieces of the undissolved resist film may cause clogging of the filter 413 or operation failure of the pump 411. The hydrogen peroxide concentration of the SPM liquid in the circulation line 410 is rapidly increased by supplying hydrogen peroxide to the outer bath 212. Accordingly, since the Caro's concentration in the SPM liquid within the circulation line 410 is also rapidly increased, dissolution of the small pieces of the resist film in the outer bath 212 into the SPM liquid is facilitated. Thus, any malfunction of the filter 413 and the pump 411 may be suppressed.

According to the above exemplary embodiment, since the supply point of hydrogen peroxide is changeable when the SPM liquid is replenished with the hydrogen peroxide, a portion where the hydrogen peroxide concentration becomes the highest may be changed depending on the situation. Since the hydrogen peroxide in the SPM liquid relatively quickly disappears by the reactions described above, changing the portion where the hydrogen peroxide concentration becomes the highest is advantageous for the efficient operation of the liquid processing apparatus.

In the above exemplary embodiment, when one of the first and second hydrogen peroxide supply units 42*a*, 42*b* supplies hydrogen peroxide, the other does not supply hydrogen peroxide. That is, when one of the opening/closing valve 424*a* and the opening/closing valve 424*b* is opened, the other is closed. Without being limited thereto, however, while supplying hydrogen peroxide from both of the first and second hydrogen peroxide supply units 42*a*, 42*b*, the supply amount from one of the first and second hydrogen peroxide supply units 42*a*, 42*b* may be set relatively large, and the supply amount from the other may be set relatively small. Specifically, for example, in the operation example described with reference to the time chart of FIG. 3, hydrogen peroxide may be supplied in a first amount (relatively small amount) from one hydrogen peroxide supply unit (e.g., 42*a*) which stops supplying, and in a second amount, which is larger than the first amount, from the other hydrogen peroxide supply unit (e.g., 42*b*).

Further, in the second replenishment step described in the above exemplary embodiment, the supply rate of the hydrogen peroxide supplied from the second hydrogen peroxide supply unit 42*b* may be set to be lower than the supply rate of the hydrogen peroxide supplied from the second hydrogen peroxide supply unit 42*b* in other replenishment steps. Therefore, the reaction rate with the resist on the surface of the wafers W in the SPM processing bath 21 decreases. Thus, it is possible to reduce the outflow of the small pieces of the undissolved resist film peeled from the wafers W from the SPM liquid processing bath 21 to the outer bath 212.

In the above exemplary embodiment, descriptions have been made based on the pre-replenishment. However, without being limited thereto, the present disclosure may also be applied to an aspect in which the feedback control is always performed for appropriate replenishment. For example, when the replenishment is controlled such that the replenishment from the second hydrogen peroxide supply unit 42b is more than that from the first hydrogen peroxide supply unit 42a for a predetermined period after the wafers are introduced into the SPM processing bath 21, and the replenishment from the first hydrogen peroxide supply unit 42a is more than that from the second hydrogen peroxide supply unit 42b after the lapse of the predetermined period, it is possible to remove the wafers W in a short time, and dissolve the spilled small pieces of the undissolved resist film in the SPM liquid in a short time.

In the above exemplary embodiment, the first hydrogen peroxide supply unit 42a and the second hydrogen peroxide supply unit 42b supply hydrogen peroxide from the same hydrogen peroxide tank 421, but not limited thereto. Each of the first hydrogen peroxide supply unit 42a and the second hydrogen peroxide supply unit 42b may have a separate hydrogen peroxide tank, and supply hydrogen peroxide from the separate hydrogen peroxide tank.

The substrate that is a processing target is not limited to the semiconductor wafer W, but may be another kind of substrate such as, for example, a glass substrate or a ceramic substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
a processing bath in which a mixture of sulfuric acid and hydrogen peroxide is stored, and a substrate is immersed in the stored mixture such that a processing is performed on the substrate;
an outer bath configured to receive the mixture flowing out from the processing bath;
a circulation line including a pump and a filter connected to the pump, and configured to return the mixture in the outer bath to the processing bath;
a sulfuric acid supply unit including a sulfuric acid supply line and configured to directly supply the sulfuric acid to the mixture in the outer bath through a tip end of the sulfuric acid supply line;
a first hydrogen peroxide supply unit including a first branch supply line and a hydrogen peroxide pump connected to the first branch supply line, the hydrogen peroxide pump being configured to directly supply the hydrogen peroxide to the mixture in the outer bath through a tip end of the first branch supply line;
a second hydrogen peroxide supply unit including a second branch supply line and configured to supply the hydrogen peroxide to the mixture flowing through a downstream side of the pump and the filter in the circulation line; and
a sampling line branched from the circulation line to be connected to the outer bath and including a concentration sensor configured to monitor concentrations of the hydrogen peroxide and the sulfuric acid contained in the mixture, respectively, such that the concentrations of the hydrogen peroxide and the sulfuric acid are maintained in a predetermined range, respectively,
a controller programmed to control operations of the sulfuric acid supply unit, the first hydrogen peroxide supply unit, the second hydrogen peroxide supply unit and the concentration sensor,
wherein the controller is further programmed to perform a replenishment of the hydrogen peroxide during the predetermined time period such that:
a supply amount of the hydrogen peroxide supplied from the second hydrogen peroxide supply unit is set to be greater than a supply amount of the hydrogen peroxide supplied from the first hydrogen peroxide supply unit in a first period after the substrate is introduced into the processing bath, and
the supply amount of the hydrogen peroxide supplied from the first hydrogen peroxide supply unit is set to be greater than the supply amount of the hydrogen peroxide supplied from the second hydrogen peroxide supply unit while the substrate is in the processing bath in a second period after the first period.

2. The substrate liquid processing apparatus of claim 1, wherein the controller is programmed to perform a feedback control based on the concentrations of the hydrogen peroxide and the sulfuric acid that are monitored by the concentration sensor, respectively, such that:
when the concentration of the hydrogen peroxide monitored by the concentration sensor is lower than a lower limit of the predetermined range, a predetermined amount of the hydrogen peroxide is supplied to the mixture from one of the first hydrogen peroxide supply unit and the second hydrogen peroxide supply unit, and
when the concentration of the sulfuric acid monitored by the concentration sensor is lower than a lower limit of the predetermined range, a predetermined amount of the sulfuric acid is supplied to the mixture from the sulfuric acid supply unit, and
wherein the controller is further programmed to perform the replenishment of the hydrogen peroxide to the mixture during a predetermined time period before and after the substrate is introduced into the processing bath while the feedback control is being OFF such that:
a supply amount of the hydrogen peroxide supplied from one of the first hydrogen peroxide supply unit and the second hydrogen peroxide supply unit is set to be greater than a supply amount of the hydrogen peroxide supplied from the other of the first hydrogen peroxide supply unit and the second hydrogen peroxide supply unit, and
after the replenishment of the hydrogen peroxide to the mixture is completed, the feedback control becomes ON again.

3. The substrate liquid processing apparatus of claim 1, wherein the controller is further programmed to perform the replenishment of the hydrogen peroxide during the predetermined time period such that:
the supply amount of the hydrogen peroxide supplied from the first hydrogen peroxide supply unit is set to be greater than the supply amount of the hydrogen peroxide supplied from the second hydrogen peroxide supply unit in a third period before the substrate is introduced into the processing bath.

4. The substrate liquid processing apparatus of claim 1, wherein the controller is further programmed to perform the replenishment of the hydrogen peroxide such that:
a supply rate of the hydrogen peroxide supplied from the second hydrogen peroxide supply unit in the first period is set to be lower than a supply rate of the hydrogen peroxide supplied from the second hydrogen peroxide supply unit in the second period.

5. The substrate liquid processing apparatus of claim 1, wherein the controller is further programmed to perform the replenishment of the hydrogen peroxide such that the supply amount of the hydrogen peroxide supplied from the first hydrogen peroxide supply unit in the first period is zero (0), and the supply amount of the hydrogen peroxide supplied from the second hydrogen peroxide supply unit in the second period is zero (0).

6. The substrate liquid processing apparatus of claim 1, wherein the tip end of the first branch supply line is positioned adjacent a bottom portion of the outer bath.

7. The substrate liquid processing apparatus of claim 6, wherein the tip end of the sulfuric acid supply line is located in the outer bath at a position higher than the tip end of the first branch supply line.

8. A substrate liquid processing method using a substrate liquid processing apparatus comprising:
a processing bath in which a mixture of sulfuric acid and hydrogen peroxide is stored, and a substrate is immersed in the stored mixture such that a processing is performed on the substrate;
an outer bath configured to receive the mixture flowing out from the processing bath;
a circulation line including a pump and a filter connected to the pump, and configured to return the mixture in the outer bath to the processing bath;
a sulfuric acid supply unit including a sulfuric acid supply line and configured to directly supply sulfuric acid to the mixture in the outer bath through a tip end of the sulfuric acid supply line;
a first hydrogen peroxide supply unit including a first branch supply line and a hydrogen peroxide pump connected to the first branch supply line, the hydrogen peroxide pump being configured to directly supply hydrogen peroxide to the mixture in the outer bath through a tip end of the first branch supply line;
a second hydrogen peroxide supply unit including a second branch supply line and configured to supply hydrogen peroxide to the mixture flowing through a downstream side of the pump and the filter in the circulation line; and
a sampling line branched from the circulation line to be connected to the outer bath and including a concentration sensor configured to monitor concentrations of the hydrogen peroxide and the sulfuric acid contained in the mixture, respectively, such that the concentrations of the hydrogen peroxide and the sulfuric acid are maintained in a predetermined range, respectively,
wherein the substrate liquid processing method comprising:
performing a feedback control based on the concentrations of the hydrogen peroxide and the sulfuric acid that are monitored by the concentration sensor, respectively such that:
when the concentration of the hydrogen peroxide monitored by the concentration sensor is lower than a lower limit of the predetermined range, a predetermined amount of the hydrogen peroxide is supplied to the mixture from one of the first hydrogen peroxide supply unit and the second hydrogen peroxide supply unit, and
when the concentration of the sulfuric acid monitored by the concentration sensor is lower than a lower limit of the predetermined range, a predetermined amount of the sulfuric acid is supplied to the mixture from the sulfuric acid supply unit;

performing a replenishment of the hydrogen peroxide to the mixture during a predetermined time period before and after the substrate is introduced into the processing bath while the feedback control is being OFF such that:
a supply amount of the hydrogen peroxide supplied from the second hydrogen peroxide supply unit is set to be greater than a supply amount of the hydrogen peroxide supplied from the first hydrogen peroxide supply unit in a first period after the substrate is introduced into the processing bath during the predetermined time period,
the supply amount of the hydrogen peroxide supplied from the first hydrogen peroxide supply unit is set to be greater than the supply amount of the hydrogen peroxide supplied from the second hydrogen peroxide supply unit while the substrate is in the processing bath in a second period after the first period during the predetermined time period, and
after the replenishment of the hydrogen peroxide to the mixture is completed, the feedback control becomes ON again.

9. The substrate liquid processing method of claim 8, further comprising:
performing the replenishment of the hydrogen peroxide during the predetermined time period such that the supply amount of the hydrogen peroxide supplied from the first hydrogen peroxide supply unit is set to be greater than the supply amount of the hydrogen peroxide supplied from the second hydrogen peroxide supply unit in a third period before the substrate is introduced into the processing bath.

10. The substrate liquid processing method of claim 8, further comprising:
performing the replenishment of the hydrogen peroxide such that a supply rate of the hydrogen peroxide supplied from the first hydrogen peroxide supply unit is set to be lower than a supply rate of the hydrogen peroxide supplied from the first hydrogen peroxide supply unit in the second period.

11. The substrate liquid processing method of claim 8, further comprising:
performing the replenishment of the hydrogen peroxide such that the supply amount of the hydrogen peroxide supplied from the first hydrogen peroxide supply unit in the first period is zero (0), and the supply amount of the hydrogen peroxide supplied from the second hydrogen peroxide supply unit in the second period is zero (0).

12. A non-transitory computer-readable storage medium that stores a program for controlling a substrate processing apparatus in which, when executed, cause a computer to control the substrate liquid processing apparatus and execute the substrate liquid processing method of claim 8.

13. A substrate liquid processing apparatus comprising:
a processing bath in which a mixture of sulfuric acid and hydrogen peroxide is stored, and a substrate is immersed in the stored mixture such that a processing is performed on the substrate;
an outer bath configured to receive the mixture flowing out from the processing bath;
a circulation line configured to return the mixture in the outer bath to the processing bath;
a sulfuric acid supply unit including a sulfuric acid supply line and configured to directly supply the sulfuric acid to the mixture in the outer bath through a tip end of the sulfuric acid supply line;
a device provided in the circulation line, and including a filter configured to remove a solid impurity in the mixture and a pump configured to form a circulation flow of the mixture in a circulation system including the processing bath, the outer bath, and the circulation line;

a first hydrogen peroxide supply unit including a first branch supply line and a hydrogen peroxide pump connected to the first branch supply line, the hydrogen peroxide pump being configured to directly supply the hydrogen peroxide to the mixture in the circulation system through a tip end of the first branch supply line, the first hydrogen peroxide supply unit being provided to supply the hydrogen peroxide to the outer bath such that the hydrogen peroxide is supplied to the circulation line at an upstream position of the device; and a second hydrogen peroxide supply unit including a second branch supply line and configured to supply hydrogen peroxide to the mixture in the circulation system, and the second hydrogen peroxide supply unit being provided to supply hydrogen peroxide to the circulation line at a downstream side of the device; and a sampling line branched from the circulation line to be connected to the outer bath and including a concentration sensor configured to monitor concentrations of the hydrogen peroxide and the sulfuric acid contained in the mixture, respectively, such that the concentrations of the hydrogen peroxide and the sulfuric acid are maintained in a predetermined range, respectively, a controller programmed to control operations of the sulfuric acid supply unit, the first hydrogen peroxide supply unit, the second hydrogen peroxide supply unit and the concentration sensor, wherein the controller is further programmed to perform a replenishment of the hydrogen peroxide during the predetermined time period such that:

a supply amount of the hydrogen peroxide supplied from the second hydrogen peroxide supply unit is set to be greater than a supply amount of the hydrogen peroxide supplied from the first hydrogen peroxide supply unit in a first period after the substrate is introduced into the processing bath, and the supply amount of the hydrogen peroxide supplied from the first hydrogen peroxide supply unit is set to be greater than the supply amount of the hydrogen peroxide supplied from the second hydrogen peroxide supply unit while the substrate is in the processing bath in a second period after the first period.

14. The substrate liquid processing apparatus of claim 13, wherein the end tip end of the first branch supply line is positioned adjacent a bottom portion of the outer bath.

15. The substrate liquid processing apparatus of claim 14, wherein the tip end of the sulfuric acid supply line is located in the outer bath at a position higher than the tip end of the first branch supply line.

16. A substrate liquid processing method using a substrate liquid processing apparatus comprising:

a processing bath in which a mixture of sulfuric acid and hydrogen peroxide is stored, and a substrate is immersed in the stored mixture such that a processing is performed on the substrate;

an outer bath configured to receive the mixture flowing out from the processing bath, a circulation line configured to return the mixture in the outer bath to the processing bath;

a sulfuric acid supply unit including a sulfuric acid supply line and configured to directly supply sulfuric acid to the mixture in the outer bath through a tip end of the sulfuric acid supply line;

a device provided in the circulation line, and including a filter configured to remove a solid impurity in the mixture and a pump configured to form a circulation flow of the mixture in a circulation system including the processing bath, the outer bath, and the circulation line;

a first hydrogen peroxide supply unit including a first branch supply line and a hydrogen peroxide pump connected to the first branch supply line, the hydrogen peroxide pump being configured to directly supply hydrogen peroxide to the mixture in the circulation system through a tip end of the first branch supply line, the first hydrogen peroxide supply unit being provided to supply hydrogen peroxide to the outer bath, or to the circulation line at an upstream position of the device; and a second hydrogen peroxide supply unit including a second branch supply line and configured to supply hydrogen peroxide to the mixture in the circulation system, the second hydrogen peroxide supply unit being provided to supply hydrogen peroxide to the circulation line at a downstream side of the device in the circulation line; and a sampling line branched from the circulation line to be connected to the outer bath and including a concentration sensor configured to monitor concentrations of the hydrogen peroxide and the sulfuric acid contained in the mixture, respectively, such that the concentrations of the hydrogen peroxide and the sulfuric acid are maintained in a predetermined range, respectively, and wherein the substrate liquid processing method comprising:

performing a feedback control based on the concentrations of the hydrogen peroxide and the sulfuric acid that are monitored by the concentration sensor, respectively such that:

when the concentration of the hydrogen peroxide monitored by the concentration sensor is lower than a lower limit of the predetermined range, a predetermined amount of the hydrogen peroxide is supplied to the mixture from one of the first hydrogen peroxide supply unit and the second hydrogen peroxide supply unit, and when the concentration of the sulfuric acid monitored by the concentration sensor is lower than a lower limit of the predetermined range, a predetermined amount of the sulfuric acid is supplied to the mixture from the sulfuric acid supply unit;

performing a replenishment of the hydrogen peroxide to the mixture during a predetermined time period before and after the substrate is introduced into the processing bath while the feedback control is being OFF such that:

a supply amount of the hydrogen peroxide supplied from the second hydrogen peroxide supply unit is set to be greater than a supply amount of the hydrogen peroxide supplied from the first hydrogen peroxide supply unit in a first period after the substrate is introduced into the processing bath during the predetermined time period, the supply amount of the hydrogen peroxide supplied from the first hydrogen peroxide supply unit is set to be greater than the supply amount of the hydrogen peroxide supplied from the second hydrogen peroxide supply unit while the substrate is in the processing bath in a second period after the first period during the predetermined time period, and after the replenishment of the hydrogen peroxide to the mixture is completed, the feedback control becomes ON again.

* * * * *